(12) United States Patent
Azumo et al.

(10) Patent No.: US 8,900,991 B2
(45) Date of Patent: Dec. 2, 2014

(54) FILM FORMING METHOD AND STORAGE MEDIUM

(75) Inventors: Shuji Azumo, Nirasaki (JP); Yasuhiko Kojima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 277 days.

(21) Appl. No.: 13/402,385

(22) Filed: Feb. 22, 2012

(65) Prior Publication Data

US 2012/0220121 A1 Aug. 30, 2012

(30) Foreign Application Priority Data

Feb. 24, 2011 (JP) ................. 2011-038774

(51) Int. Cl.
*H01L 21/768* (2006.01)
*C23C 16/16* (2006.01)
*C23C 16/448* (2006.01)
*H01L 23/532* (2006.01)
*H01L 21/285* (2006.01)

(52) U.S. Cl.
CPC .... *H01L 21/28556* (2013.01); *H01L 21/76846* (2013.01); *C23C 16/16* (2013.01); *C23C 16/4488* (2013.01); *H01L 21/76873* (2013.01); *H01L 23/53238* (2013.01); *H01L 21/76843* (2013.01)
USPC .................. 438/653; 257/E21.584

(58) Field of Classification Search
CPC .................. H01L 21/28556; H01L 21/53238; H01L 21/76846; H01L 21/76873; H01L 21/76843; C23C 16/16; C23C 16/4488
USPC .................. 438/618, 625, 627–630, 651–653
See application file for complete search history.

(56) References Cited

U.S. PATENT DOCUMENTS

| | | | | |
|---|---|---|---|---|
| 7,220,669 B2* | 5/2007 | Hujanen et al. | ............... | 438/650 |
| 7,678,421 B2* | 3/2010 | Suzuki et al. | ................. | 427/250 |
| 7,759,187 B2* | 7/2010 | Marsh | ............. | 438/239 |
| 8,133,811 B2* | 3/2012 | Kojima et al. | ................ | 438/679 |
| 2004/0203233 A1* | 10/2004 | Kang et al. | .................. | 438/686 |
| 2009/0017619 A1* | 1/2009 | Lee et al. | ...................... | 438/664 |
| 2009/0022891 A1* | 1/2009 | Sakai et al. | ................... | 427/252 |
| 2009/0029047 A1* | 1/2009 | Yoshii et al. | .................. | 427/250 |
| 2009/0053426 A1* | 2/2009 | Lu et al. | ...................... | 427/540 |
| 2011/0057317 A1* | 3/2011 | Koike et al. | .................... | 257/751 |
| 2011/0174630 A1* | 7/2011 | Kojima et al. | ................ | 205/186 |
| 2011/0183517 A1* | 7/2011 | Auth et al. | .................... | 438/667 |
| 2011/0236583 A1* | 9/2011 | Nishimura et al. | ........... | 427/331 |
| 2012/0171365 A1* | 7/2012 | Azumo et al. | ................ | 427/124 |
| 2012/0252207 A1* | 10/2012 | Lei et al. | ...................... | 438/653 |

FOREIGN PATENT DOCUMENTS

JP  2010-159447 A  7/2010

OTHER PUBLICATIONS

Hwa Sung Rhee, et al., "Cobalt Metallorganic Chemical Vapor Deposition and Formation of Epitaxial $CoSi_2$ Layer on Si(100) Substrate", Journal of the Electrochemical Society, 1999, 146 (7), pp. 2720-2724.

* cited by examiner

*Primary Examiner* — Savitr Mulpuri
(74) *Attorney, Agent, or Firm* — Rothwell, Figg, Ernst & Manbeck, P.C.

(57) ABSTRACT

In a film forming method for forming a Co film on a substrate provided in a processing chamber, gaseous $Co_4(CO)_{12}$ as a single film forming material is supplied into the processing chamber. Then, the gaseous $Co_4(CO)_{12}$ is thermally decomposed on the substrate to form the Co film on the substrate.

6 Claims, 4 Drawing Sheets

FILM FORMING METHOD AND STORAGE MEDIUM

CROSS-REFERENCE TO RELATED APPLICATIONS

This application claims priority to Japanese Patent Application No. 2011-038774 filed on Feb. 24, 2011, the entire contents of which are incorporated herein by reference.

FIELD OF THE INVENTION

The present invention relates to a film forming method for forming a Co film by a CVD method, and a storage medium.

BACKGROUND OF THE INVENTION

Recently, along with the trend toward high speed of semiconductor devices and miniaturization of wiring patterns, Cu having higher conductivity than Al and also having high electromigration resistance has been in the spotlight as a material for the wiring. Conventionally, a Cu wiring has been formed by electroplating, and Cu has been used as a seed of the Cu wiring. However, in view of better embedding characteristic, studies have been made to use Co instead of Cu as the seed of the Cu wiring formed by electroplating. Further, it also has been proposed to use a Co film as a Cu diffusion barrier layer.

As for a Co film forming method, a physical vapor deposition (PVD) method represented by sputtering has been widely employed. However, it is disadvantageous in that step coverage deteriorates due to miniaturization of semiconductor devices.

Therefore, there is provided a chemical vapor deposition (CVD) method for forming a Co film on a substrate by thermal decomposition of a film forming material gas containing Co or reduction reaction using a reduction gas of the film forming material gas. The Co film formed by the CVD method has a high step coverage and can be easily formed in a thin, long and deep pattern. Therefore, the Co film has high conformability to a fine pattern and is preferably used as a Cu plating seed layer.

As for a Co film forming method by a CVD method, there is suggested a method for supplying gaseous cobalt carbonyl $(Co_2(CO)_8)$ as a film forming material into a chamber and thermally decomposing the cobalt carbonyl on a substrate in the chamber (e.g., Journal of The Electrochemical Society, 146(7)2720-2724(1999)).

However, when $Co_2(CO)_8$ is used as a film forming material, $Co_4(CO)_{12}$ may be generated by polymerization reaction during the transfer of $Co_2(CO)_8$ and, thus, the mixture of $Co_2(CO)_8$ and $Co_4(CO)_{12}$ may be supplied. If the film forming material supplied in such mixed state is decomposed on the substrate, a Co film having poor step coverage is formed and the reproducibility of the film formation process deteriorates.

SUMMARY OF THE INVENTION

In view of the above, the present invention provides a film forming method capable of forming a Co film by using cobalt carbonyl as a film forming material while ensuring good step coverage and reproducibility.

Further, the present invention provides a storage medium storing a program for performing the film forming method.

In accordance with an aspect of the present invention, there is provided a film forming method including: providing a substrate in a processing chamber; supplying gaseous $Co_4(CO)_{12}$ as a single film forming material into the processing chamber; and thermally decomposing the gaseous $Co_4(CO)_{12}$ on the substrate to form a Co film on the substrate.

Further, it is preferable that $Co_2(CO)_8$ is used as a solid film forming material, the solid $Co_2(CO)_8$ is vaporized to be a gaseous $Co_2(CO)_8$ by heating at a temperature lower than a decomposition start temperature of the $Co_2(CO)_8$, the gaseous $Co_2(CO)_8$ is changed into the gaseous $Co_4(CO)_{12}$ by heating at a temperature at which the gaseous $Co_4(CO)_{12}$ stably exists, and the gaseous $Co_4(CO)_{12}$ is supplied into the processing chamber.

Further, it is preferable that $Co_4(CO)_{12}$ is used as a solid film forming material, the solid $Co_4(CO)_{12}$ is vaporized to be the gaseous $Co_4(CO)_{12}$ and the gaseous $Co_4(CO)_{12}$ is supplied into the processing chamber.

In accordance with another aspect of the present invention, there is provided a non-transitory computer-readable storage medium storing a program for controlling a film forming apparatus, wherein, the program, when executed by a computer, controls the film forming apparatus to perform the film forming method described above.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described with reference to the accompanying drawings which form a part hereof.

(Configuration example of film forming apparatus for performing film forming method of the present invention)

Figure 1:
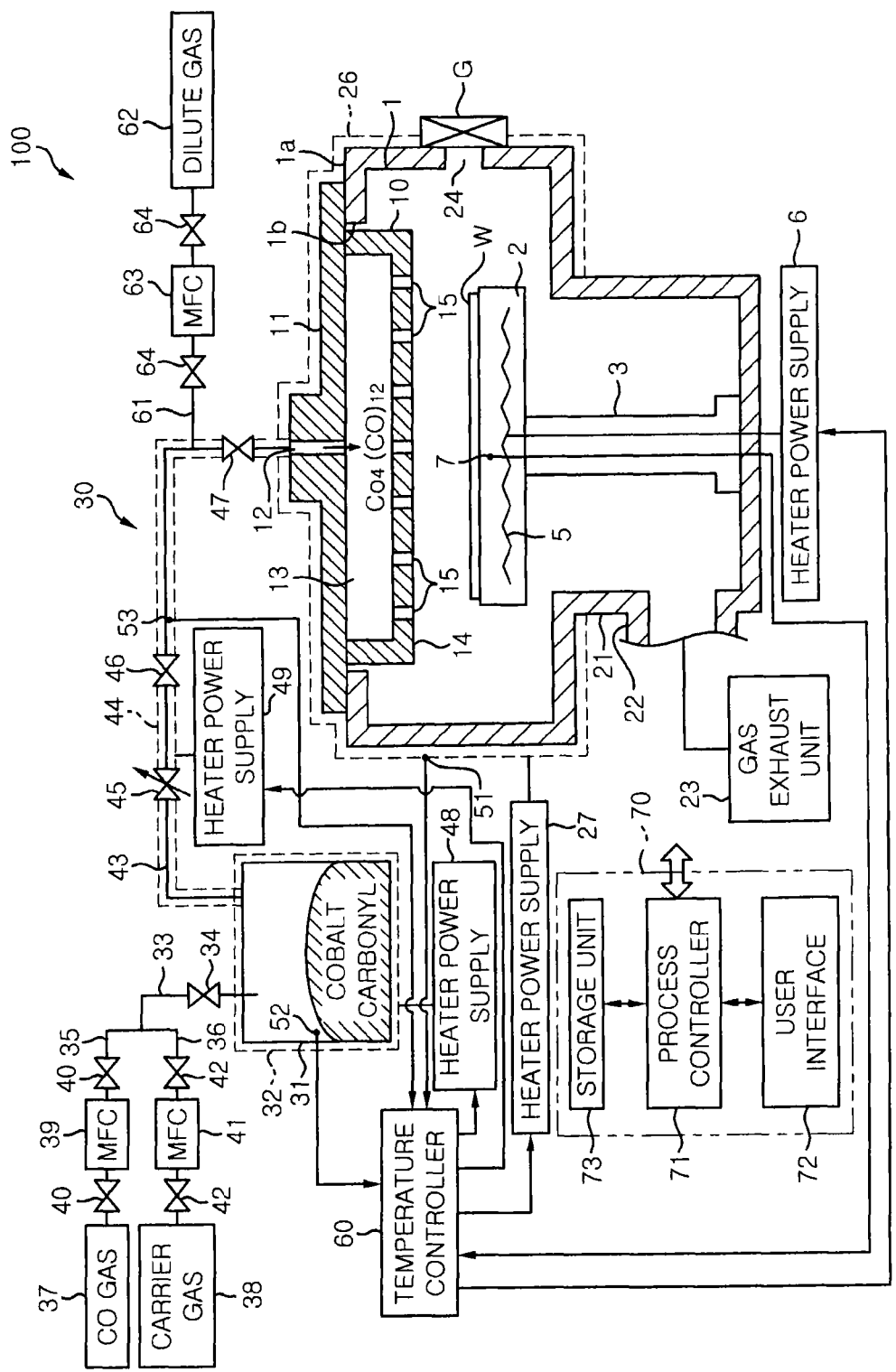
FIG. 1 is a schematic cross sectional view showing an example of a film forming apparatus for performing a film forming method in accordance with an embodiment of the present invention.

FIG. 1 is a schematic cross sectional view showing an example of a film forming apparatus for performing a film forming method in accordance with the present invention.

This film forming apparatus 100 includes a substantially cylindrical airtight chamber 1. In the chamber 1, a susceptor 2 for horizontally supporting a semiconductor wafer W as a substrate to be processed is supported by a cylindrical supporting member 3 which extends from a bottom portion of a gas exhaust chamber 21 to be described later so as to reach the central portion of the bottom surface of the susceptor 2. The susceptor 2 is made of ceramic such as AlN or the like. A heater 5 is buried in the susceptor 2 and is connected to a heater power supply 6. Further, a thermocouple 7 is provided near a top surface of the susceptor 2. A temperature detection signal of the thermocouple 7 is transmitted to a temperature controller 60 to be described later. The temperature controller 60 transmits a control signal to the heater power supply 6 based on the temperature detection signal of the thermocouple 7, and controls a temperature of the wafer W to be a predetermined level by controlling the heating of the heater 5. Further, three wafer elevation pins (not shown) are provided at the susceptor 2 so as to project and retract with respect to a top surface of the susceptor 2. When the wafer W is transferred, the wafer elevation pins project from the top surface of the susceptor 2.

A circular opening 1b is formed at a ceiling wall 1a of the chamber 1, and a shower head 10 is fitted in the opening 1b to protrude into the chamber 1. A film forming material gas supplied from a gas supply unit 30 to be described later is injected into the chamber 1 through the shower head 10. A gas inlet port 12 for introducing a film forming material gas is provided at a ceiling plate 11 of the shower head 10. A gas diffusion space 13 is formed in the shower head 10, and a plurality of gas injection holes 15 is formed in a bottom plate 14 of the shower head 10. The gas introduced into the gas diffusion space from the gas inlet port 12 is injected into the chamber 1 through the gas injection holes 15.

The gas exhaust chamber 21 is provided at a bottom wall of the chamber 1 so as to protrude downward. A gas exhaust line 22 is connected to a sidewall of the gas exhaust chamber 21, and a gas exhaust unit 23 having a vacuum pump, a pressure control valve and the like is connected to the gas exhaust line 22. By operating the gas exhaust unit 23, a pressure in the chamber 1 can be reduced to a predetermined vacuum level.

Provided on a sidewall of the chamber 1 are a loading/unloading port 24 through which a wafer W is loaded and unloaded between the chamber 1 and a wafer transfer chamber (not shown), and a gate valve 34 for opening and closing the loading/unloading port 24. In addition, a heater 26 is provided to surround the wall of the chamber 1, so that the wall of the chamber 1 can be heated during film formation. The heater 26 is powered by a heater power supply 27.

The gas supply unit 30 includes a film forming material container 31 for storing solid cobalt carbonyl, e.g., $Co_2(CO)_8$ or $Co_4(CO)_{12}$, as a film forming material. A heater 32 is provided to surround the film forming material container 31. Accordingly, cobalt carbonyl as a film forming material is vaporized by heating. The heater 32 is powered by a heater power supply 48.

A gas inlet line 33 is inserted into the film forming material container 31 from above. A valve 34 is installed in the gas inlet line 33. The gas inlet line 33 is branched into a CO gas line 35 and a carrier gas line 36. A CO gas supply source 37 is connected to the CO gas line 35, and a carrier gas supply source 38 is connected to the carrier gas line 36. Installed in the CO gas line 35 are a mass flow rate controller 39 serving as a flow rate controller and valves 40 disposed at upstream and downstream sides of the mass flow rate controller 39. Further, installed in the carrier gas line 36 are a mass flow rate controller 41 as a flow rate controller and valves 42 disposed at upstream and downstream sides of the mass flow rate controller 41. As for a carrier gas, Ar gas or $N_2$ gas may be appropriately used.

CO gas is introduced into the film forming material container 31 to suppress decomposition of vaporized cobalt carbonyl. In other words, although the decomposition of cobalt carbonyl causes generation of CO, the reaction in which cobalt carbonyl is decomposed to produce CO is suppressed by increasing CO concentration by supplying CO into the film forming material container 31. Meanwhile, a carrier gas is introduced to transfer cobalt carbonyl gas generated by evaporation in the film forming material container 31 to the chamber 1. CO gas may function as a carrier gas, and, in that case, no carrier gas is required. Further, CO gas may not be necessary.

One end of a film forming material gas supply line 43 is inserted into the film forming material container from above, and the other end of the film forming material gas supply line 43 is connected to the gas inlet port 12. Cobalt carbonyl gas heated and vaporized by the heater 32 is supplied to the shower head 10 with the carrier gas through the film forming material gas supply line 43 and the gas inlet port 12. A heater 44 is provided to surround the film forming material gas supply line 43. The heater 44 is powered by a heater power supply 49. A flow rate control valve 45, an opening/closing valve 46 disposed at a downstream side of the flow rate control valve 45, and an opening/closing valve 47 positioned near the gas inlet port 12 are installed in the film forming material gas supply line 43.

One end of a dilute gas supply line 61 is connected to an upstream side of the valve 47 in the film forming material gas supply line 43. The other end of the dilute gas supply line 61 is connected to a dilute gas supply source 62 for supplying a dilute gas, e.g., Ar gas, $N_2$ gas or the like. Installed in the dilute gas line 61 are a mass flow controller 63 as a flow rate controller and valves 64 disposed at upstream and downstream sides of the mass flow controller 63. The dilute gas also functions as a purge gas or a stabilization gas.

A thermocouple 51 is provided at the wall of the chamber 1. A thermocouple 52 is provided at the film forming material container 31. A thermocouple 53 is provided at the film forming material gas supply line 43. The thermocouples 51 to 53 are connected to the temperature controller 60. The temperature detection signals of the thermocouples 51 to 53 and the thermocouple 7 are transmitted to the temperature controller 60. The heater power supplies 6, 27, 48 and 49 are connected to the temperature controller 60. The temperature controller 60 transmits control signals to the heater power supplies 6, 27, and 49 based on the detection signals of the thermocouples 7, 51, 52 and 53, respectively. Accordingly, the temperature of the susceptor 2, the temperature of the wall of the chamber 1, the temperature in the film forming material container 31, and the temperature in the film forming material gas supply line 43 can be controlled by the heaters 5, 26, 32 and 44, respectively.

The film forming apparatus 100 includes a control unit 70 for controlling components such as the temperature controller 60, the gas exhaust unit 23, the mass flow controllers, the flow rate control valves, the valves, and the like. With respect to the temperature controller 60, the control unit 70 sets temperatures of parts which are controlled by the temperature controller 60.

The control unit 70 includes a process controller 71 having a microprocessor (computer) 71, a user interface 72, and a storage unit 73. Each of the components of the film forming apparatus 100 is electrically connected to and controlled by the process controller 71. The user interface 72 is connected to the process controller 71, and includes a keyboard through which an operator inputs commands for managing each component of the film forming apparatus 100, a display for visually displaying an operating state of each component of the film formation apparatus 100, and the like. The storage unit 73 is also connected to the process controller 71, and stores therein a control program for implementing various processes performed in the film forming apparatus 100 under the control of the process controller 71 and a control program for implementing a predetermined process in each component of the film forming apparatus 100 in accordance with process conditions, i.e., process recipes, various database, and the like. The process recipes are stored in a storage medium (not shown) in the storage unit 73. The storage medium may be a fixed medium, such as a hard disk or the like, or a portable medium such as a CD-ROM, a DVD, a flash memory, or the like. Further, the recipes may be appropriately transmitted from another device through, e.g., a dedicated line.

If necessary, a desired process is performed in the film forming apparatus 100 under the control of the process controller 71 by reading out a predetermined process recipe from the storage unit 73 in response to an instruction or the like from the user interface 72 and executing the process recipe in the process controller 71.

(Film Forming Method in Accordance With First Embodiment of the Present Invention)

Hereinafter, there will be explained a film forming method in accordance with a first embodiment of the present invention which is performed by the film forming apparatus configured as described above.

Figure 2:
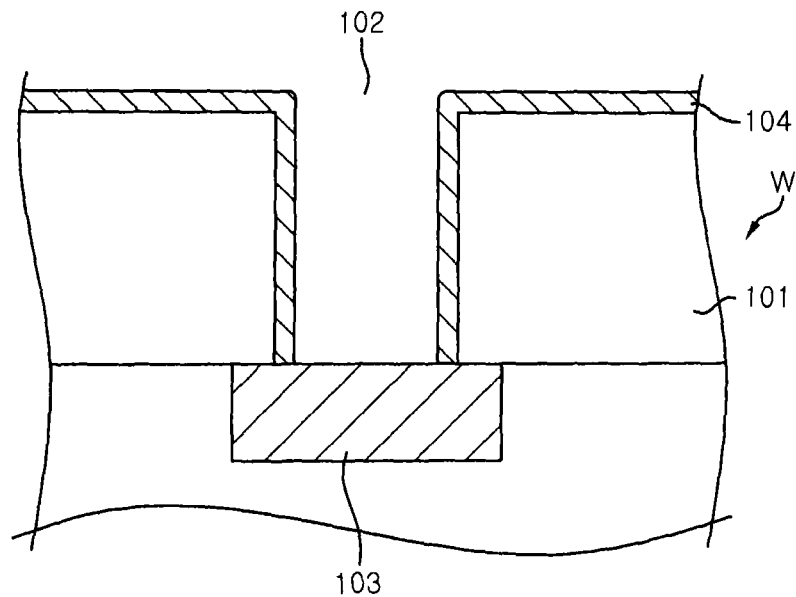
FIG. 2 is a cross sectional view showing an example of a structure of a wafer in the case of using a Co film as a seed layer of Cu wiring formed by electroplating.
Figure 3:
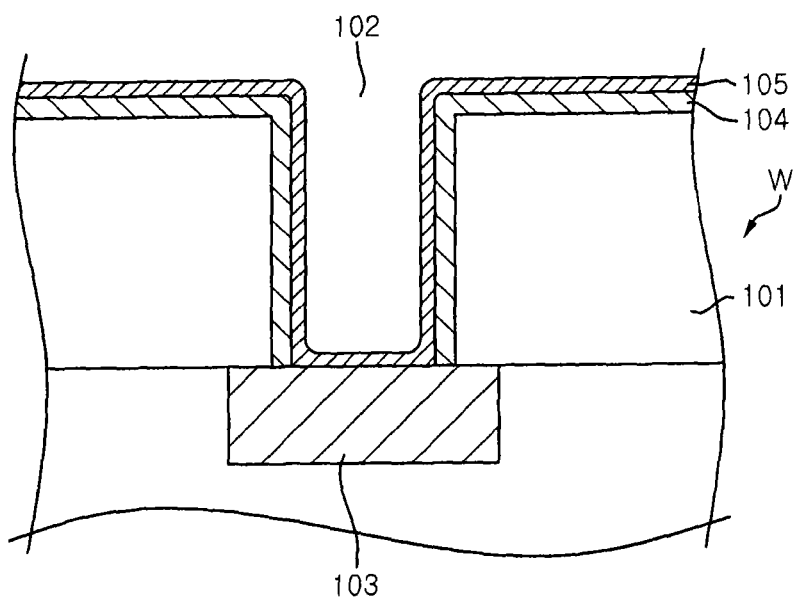
FIG. 3 is a cross sectional view showing another example of a structure of a wafer in the case of using a Co film as a seed layer of Cu wiring formed by electroplating.

In the present embodiment, there is formed a Co film used as a seed layer of Cu wiring to be formed by electroplating. When the Co film is used as the seed layer of Cu wiring, a wafer W having a structure shown in FIGS. 2 and 3 is used. FIG. 2 shows a structure in which a hole 102 reaching an underlying wiring layer 103 is formed in a silicon substrate 101 and an insulating film 104 is formed on the entire surface of the silicon substrate 101. FIG. 3 shows a structure in which a barrier film 105 is formed on the insulating film 104.

As for the underlying wiring layer 103, it is possible to use Al film, W film, Cu film or the like. As for the insulating film 104, it is possible to use a $SiO_2$ film, a $SiO_xC_y$-based insulating film (x and y being positive integers), an organic material-based insulating film. As for the barrier film 105, it is possible to use a laminated film of TiN/Ti (upper layer being TiN film), Ti film, TiN film, Ta film or the like.

In the present embodiment, when a Co film forming process is performed, solid $Co_2(CO)_8$ as a film forming material is stored in the film forming material container 31, and the temperature of the susceptor 2 in the chamber 1 and the temperature of the wall of the chamber 1 are controlled to a film forming temperature. Next, the gate valve G is opened, and the wafer W having a structure shown in FIG. 2 or 3 is loaded into the chamber 1 and mounted on the susceptor 2 by a transfer device (not shown).

Then, the chamber 1 is exhausted by the gas exhaust unit 23 so that a pressure in the chamber 1 is set to about 133 Pa to 1333 Pa (1 Torr to 10 Torr). The susceptor 2 is heated by the heater 5, so that the temperature of the susceptor 2 (temperature of the semiconductor wafer W) is set to be in a range from 120° C. to 300° C., preferably.

Next, dilute gas is supplied into the chamber 1 from the dilute gas supply source 62 by closing the valve 46 and opening the valves 47 and 64, thereby performing stabilization.

Meanwhile, the film forming material container 31 is heated by the heater 32 while precisely controlling its temperature to a predetermined temperature lower than a decomposition start temperature of cobalt carbonyl ($Co_2(CO)_8$). After the stabilization using the dilute gas is performed for a predetermined period of time, the supply of the dilute gas is stopped, or the dilute gas is supplied at a predetermined flow rate. Then, CO gas and/or carrier gas is supplied into the film forming material container 31, and, the valve 46 is opened to supply vaporized $Co_2(CO)_8$ gas in the film forming material container 31 into the film forming material gas supply line 43 with the carrier gas.

The film forming material gas supply line 43 is heated by the heater 44 to a temperature at which $Co_4(CO)_{12}$ stably exists, so that the $Co_2(CO)_8$ gas is changed into the $Co_4(CO)_{12}$ gas. The $Co_4(CO)_{12}$ gas is supplied into the chamber 1 from the shower head 10 through the gas supply line 43. At this time, the wall of the chamber 1 is also heated by the heater 26 to the temperature at which $Co_4(CO)_{12}$ stably exists.

The $Co_4(CO)_{12}$ gas supplied into the chamber 1 reaches the surface of the wafer W heated to a predetermined temperature by the heater 5 in the susceptor 2. The $Co_4(CO)_{12}$ gas is thermally decomposed thereon, and a Co film is formed.

Upon completion of the formation of the Co film, a purge process is performed. In the purge process, the supply of the $Co_4(CO)_{12}$ gas is stopped by stopping the supply of the carrier gas to the film forming material container 31 and, then, the inside of the chamber 1 is purged by supplying a dilute gas as a purge gas from the dilute gas supply source 62 while maximizing the operation of the vacuum pump of the gas exhaust unit 23. In that case, it is preferable to intermittently supply the dilute gas in order to purge the inside of the chamber 1 as fast as possible.

After the purge process is completed, the gate valve G is opened, and the wafer W is unloaded by the transfer device (not shown) through the loading/unloading port 24. Accordingly, a series of processes for a single wafer W is completed.

Conventionally, when a Co film is formed by using $Co_2(CO)_8$ as a film forming material, the temperatures of $Co_2(CO)_8$ is controlled to a temperature at which decomposition of $Co_2(CO)_8$ does not occur and $Co_2(CO)_8$ is supplied in a gaseous state into the chamber 1. However, in an actual case, a part of $Co_2(CO)_8$ is polymerized and vaporized into $Co_4(CO)_{12}$, so that the mixture of $Co_2(CO)_8$ and $Co_4(CO)_{12}$ is supplied. Therefore, when the Co film is formed by decomposition of the mixture of $Co_2(CO)_8$ and $Co_4(CO)_{12}$ on the wafer W, the step coverage of the Co film is poor and the reproducibility of the film formation is low.

On the other hand, in the present embodiment, as described above, in the film forming material container 31, the decomposition of $Co_2(CO)_8$ is prevented by heating $Co_2(CO)_8$ while precisely controlling the temperature of the film forming material container 31 to a predetermined temperature lower than a decomposition start temperature by the heater 32. While transferring the film forming material gas from the film forming material container 31 to the wafer W, the film forming material gas supply line 43 and the wall of the chamber 1 are heated to a temperature at which $Co_4(CO)_{12}$ gas stably exists. Hence, $Co_2(CO)_8$ gas is actively changed into $Co_4(CO)_{12}$ gas, and $Co_4(CO)_{12}$ gas is supplied as a single film forming material into the chamber 1. Specifically, the film forming material gas supply line 43 and the wall of the chamber 1 are heated by the heaters 44 and 26, respectively, to the temperature at which $Co_4(CO)_{12}$ gas stably exists.

The $Co_4(CO)_{12}$ gas is heated and decomposed on the wafer W, thereby forming a Co film. Since the $Co_4(CO)_{12}$ gas is supplied as a single film forming material, the deterioration of step coverage and reproducibility is prevented, and a Co film having good step coverage can be formed with high reproducibility.

Further, it is preferable to provide a heater for heating the shower head 10 to a temperature at which the $Co_4(CO)_{12}$ gas stably exists. The shower head 10 may not be provided, and $Co_4(CO)_{12}$ gas may be directly introduced into the chamber 1 through the gas inlet port 12.

The complete decomposition temperature of the $Co_2(CO)_8$ gas which is measured by DTA (Differential Thermal Analysis) is about 120° C. Therefore, $Co_2(CO)_8$ gas can be completely decomposed into Co and CO at about 120° C. or higher. Meanwhile, when the temperature exceeds about 300° C., Co is aggregated. Therefore, the temperature of the wafer W during film formation (film formation temperature) is preferably set in a range from about 120° C. to 300° C.

Figure 4:
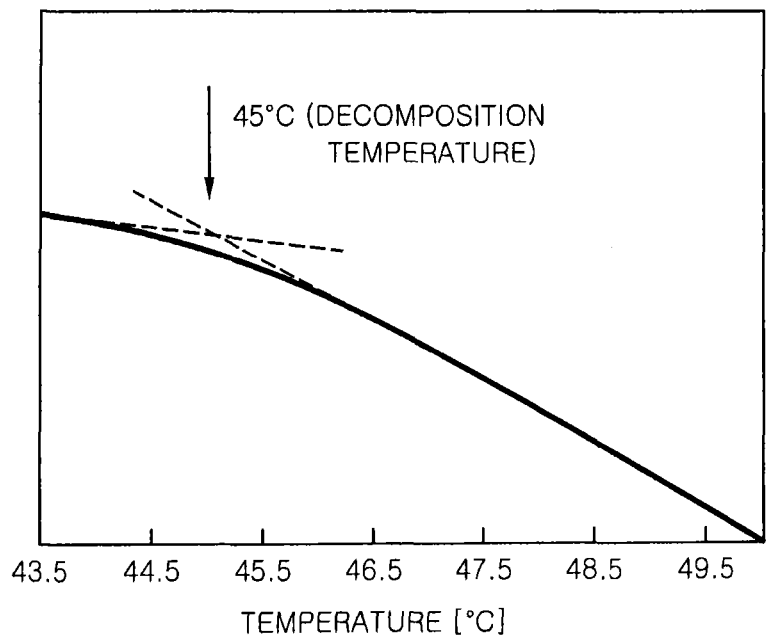
FIG. 4 is a depressurization TG chart of $Co_2(CO)_8$.

A decomposition temperature of a compound such as $Co_2(CO)_8$ gas is commonly measured by DTA, and a decomposition start temperature of the $Co_2(CO)_8$ gas measured by DTA is about 51° C. This temperature is very close to a decomposition start temperature, which is 52° C., described in Document (THE MERCK $10^{th}$ edition 3067.). However, as a result of precise measurement based on the weight change by depressurization TG (Thermogravimetry), the decomposition start temperature is about 45° C. as shown in FIG. 4. This shows that it is preferable to control the heating temperature of the film forming material container 31 to about 45° C. or less in order to suppress decomposition of $Co_2(CO)_8$ gas. Since the lower limit of the heating temperature is actually a room temperature, the heating temperature is preferably controlled between a room temperature and about 45° C.

Figure 5:
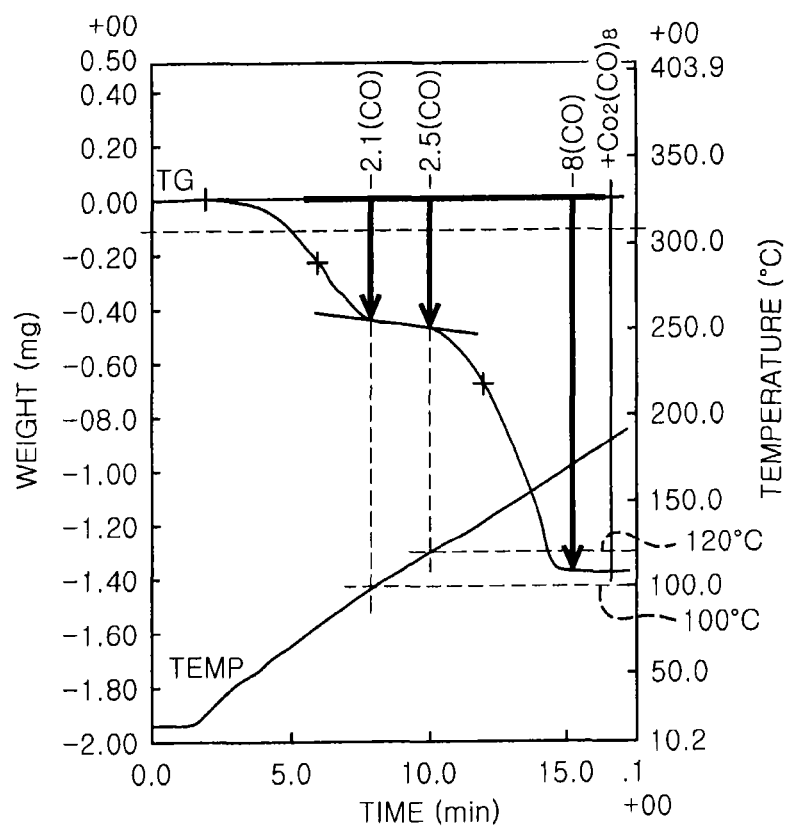
FIG. 5 is a TG-DTA chart of $Co_2(CO)_8$.

Meanwhile, $Co_4(CO)_{12}$ is generated by polymerization reaction of $Co_2(CO)_8$, and 2(CO) is separated at that time. Referring to FIG. 5 showing the result of TG-DTA of $Co_2(CO)_8$, 2(CO) is separated up to about 100° C., and the weight decrease is hardly measured from about 100° C. to about 120° C. Therefore, it is considered that the separation of 2(CO) causes generation of $Co_4(CO)_{12}$ and $Co_4(CO)_{12}$ stably exists at a temperature in a range from about 100° C. to 120° C. Therefore, the temperature of the film forming material gas obtained by vaporizing $Co_2(CO)_8$ in the film forming material container 31 is preferably maintained at a temperature in a range from about 100° C. to 120° C. until the film forming material gas is supplied to the wafer W.

In order to further suppress decomposition of $Co_2(CO)_8$ gas in the film forming material container 31, it is preferable to introduce CO gas into the film forming material container 31 while controlling a temperature of $Co_2(CO)_8$ at a level lower than a decomposition start temperature. Accordingly, the concentration of CO in the film forming material container 31 is increased, and the decomposition reaction of $Co_2(CO)_8$ can be suppressed.

Figure 6:
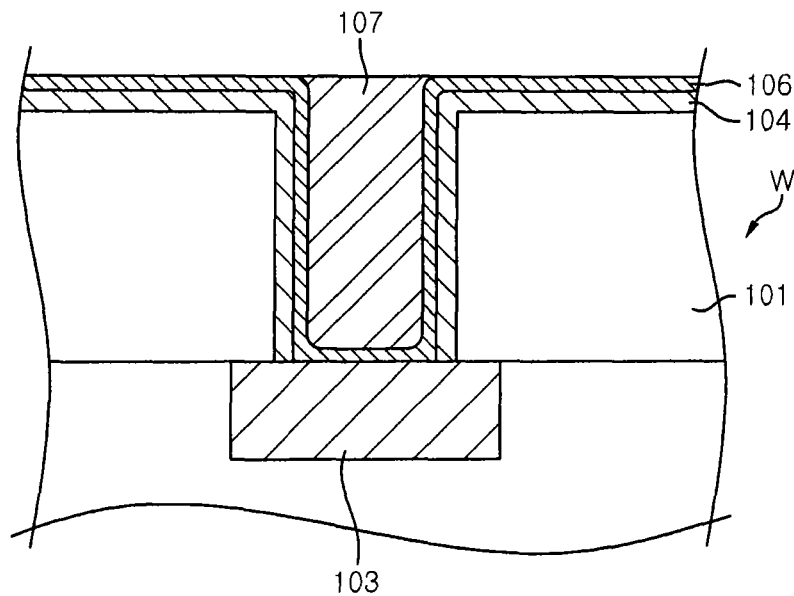
FIG. 6 is a cross sectional view showing a state in which a Co film as a seed layer is formed on the wafer having a structure shown in FIG. 2 and a Cu wiring is formed in the hole by electroplating.
Figure 7:
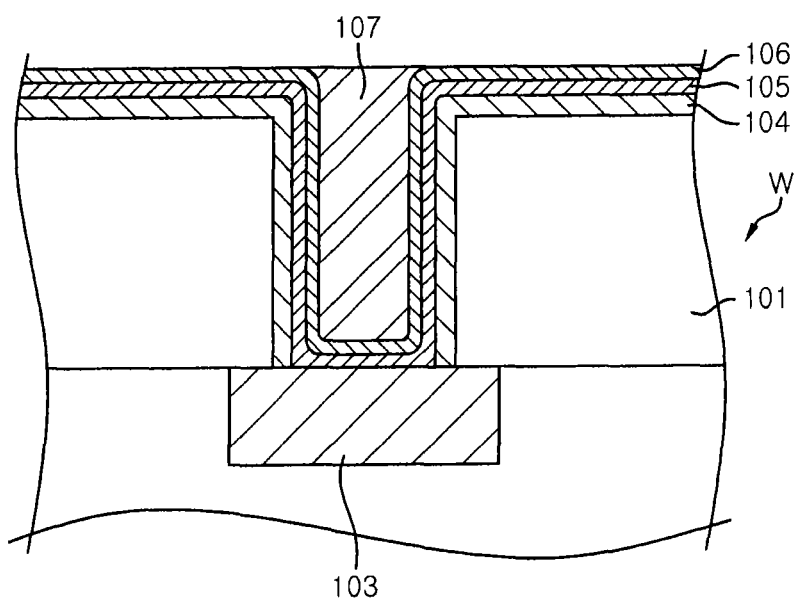
FIG. 7 is a cross sectional view showing a state in which a Co film as a seed layer is formed on the wafer having a structure shown in FIG. 3 and a Cu wiring is formed in the hole by electroplating.

With such film forming process, a Co film 106 is formed as a seed layer on the wafer W having a structure shown in FIGS. 2 and 3, and, then, a Cu film is formed in the hole 102 by electroplating. Finally, the Cu film is planarized through CMP, thereby forming a Cu wiring 107. As a consequence, the structure shown in FIGS. 6 and 7 is obtained.

Further, the Co film of the present embodiment can be used as an underlying film of the CVD-Cu film, or can also be used as a Cu diffusion barrier layer or a contact layer. In the case of using the Co film as the contact layer, the Co film formed as described above on a surface of a silicon substrate or a surface of a polysilicon layer is subjected to heat treatment for silicidation in an inert gas atmosphere or a reduction gas atmosphere. At this time, a temperature of the heat treatment is preferably set to be in a range from about 450° C. to 800° C.

(Film Forming Method in Accordance With a Second Embodiment of the Present Invention)

Hereinafter, a film forming method in accordance with a second embodiment of the present invention which is performed by using the film forming apparatus will be described.

In the first embodiment, solid $Co_2(CO)_8$ is used as a film forming material, and the solid $Co_2(CO)_8$ is vaporized and $Co_2(CO)_8$ in a gaseous state is changed to the $Co_4(CO)_{12}$ gas by polymerization reaction, so that the $Co_4(CO)_{12}$ gas is supplied to the wafer W. However, in the present embodiment, solid $Co_4(CO)_{12}$ is stored as a film forming material in the film forming material container 31. In other words, $Co_4(CO)_{12}$ is vaporized in film forming material container 31 by the heater 32, and $Co_4(CO)_{12}$ in a gaseous state is supplied to the wafer W heated by the heater 5, thereby forming a Co film. Specifically, the film forming material gas supply line 43 and the wall of the chamber 1 are heated by the heaters 44 and 26, respectively, to a temperature at which the $Co_4(CO)_{12}$ gas is maintained in a gaseous state. As in the first embodiment, the temperature of the wafer W in the present embodiment during Co film formation is preferably set to be in a range from about 120° C. to 300° C.

In the present embodiment as well, $Co_4(CO)_{12}$ gas is supplied as a single film forming material and decomposed on the wafer W, thereby forming the Co film. Therefore, the deterioration of step coverage and reproducibility is prevented, and a Co film having good step coverage can be formed with high reproducibility.

In the present embodiment, $Co_4(CO)_{12}$ is used as a solid film forming material, so that gas reaction is not required during the supply of the film forming material unlike the first embodiment, which makes the apparatus configuration simple compared to that of the first embodiment. Since, however, $Co_4(CO)_{12}$ is not easily vaporized due to its high vapor pressure compared to $Co_2(CO)_8$. For that reason, it is difficult to vaporize $Co_4(CO)_{12}$ and increase the supply amount thereof.

On the other hand, in the first embodiment, gas reaction is required during the transfer of the film forming material and, thus, the temperature needs to be precisely controlled, which makes the apparatus configuration complicated. Since, however, $Co_2(CO)_8$ is easily vaporized, it is easy to vaporize $Co_2(CO)_8$ and increase the supply amount thereof.

(Other Application of the Present Invention)

The present invention can be variously modified without being limited to the above-described embodiments. For example, the film forming apparatus is not limited to that shown in FIG. 1, and various film forming apparatuses may be employed. Further, the technique for supplying $Co_4(CO)_{12}$ as a film forming material is not limited to that described in the above embodiments, and various techniques may be employed.

Although a semiconductor wafer is used as an example of a substrate to be processed, the substrate to be processed is not limited thereto, and can be another substrate such as a flat panel display (FPD) substrate or the like.

In accordance with the present invention, gaseous $Co_4(CO)_{12}$ is supplied as a single film forming material to the substrate, so that a Co film having good step coverage can be formed with high reproducibility unlike the case of supplying the mixture of $Co_2(CO)_8$ and $Co_4(CO)_{12}$ which results in formation of a film having poor step coverage with poor reproducibility.

While the invention has been shown and described with respect to the embodiments, it will be understood by those skilled in the art that various changes and modification may be made without departing from the scope of the invention as defined in the following claims.

What is claimed is:

1. A film forming method comprising:
  providing a substrate in a processing chamber;
  supplying gaseous $Co_4(CO)_{12}$ as a single film forming material into the processing chamber; and
  thermally decomposing the gaseous $Co_4(CO)_{12}$ on the substrate to form a Co film on the substrate, and wherein $Co_2(CO)_8$ is used as a solid film forming material, the solid $Co_2(CO)_8$ is vaporized to be a gaseous $Co_2(CO)_8$ by heating at a temperature lower than a decomposition start temperature of the $Co_2(CO)_8$, the gaseous $Co_2(CO)_8$ is changed into the gaseous $Co_4(CO)_{12}$ by heating at a temperature at which the gaseous $Co_4(CO)_{12}$ stably exists, and the gaseous $Co_4(CO)_{12}$ is supplied into the processing chamber.

2. The film forming method of claim 1, wherein the solid $Co_2(CO)_8$ is vaporized by heating at a temperature lower than about 45° C.

3. The film forming method of claim 1, wherein the gaseous $Co_2(CO)_8$ is changed into the gaseous $Co_4(CO)_{12}$ by heating at a temperature in a range from about 100° C. to 120° C.

4. The film forming method of claim 2, wherein the gaseous $Co_2(CO)_8$ is changed into the gaseous $Co_4(CO)_{12}$ by heating at a temperature in a range from about 100° C. to 120° C.

5. The film forming method of claim 1, wherein the heating temperature of the substrate is set to be in a range from about 120° C. to 300° C.

6. The film forming method of claim 1, wherein after the Co film is formed, Cu is deposited thereon by electroplating.

* * * * *